(12) United States Patent
Janssens et al.

(10) Patent No.: US 9,074,282 B2
(45) Date of Patent: Jul. 7, 2015

(54) METHOD FOR DEPOSITING A MATERIAL

(75) Inventors: Jan Arnaud Janssens, Deventer (NL); Gerard Cornelis Van Den Eijkel, Losser (NL); Jan Matthijn Dekkers, Aadorp (NL); Joska Johannes Broekmaat, Enschede (NL); Paul Te Riele, The Hague (NL)

(73) Assignee: Solmates B.V., Enschede (NL)

( * ) Notice: Subject to any disclaimer, the term of this patent is extended or adjusted under 35 U.S.C. 154(b) by 837 days.

(21) Appl. No.: 13/060,340

(22) PCT Filed: Aug. 24, 2009

(86) PCT No.: PCT/EP2009/060859
§ 371 (c)(1),
(2), (4) Date: Jun. 14, 2011

(87) PCT Pub. No.: WO2010/023174
PCT Pub. Date: Mar. 4, 2010

(65) Prior Publication Data
US 2011/0236601 A1    Sep. 29, 2011

(30) Foreign Application Priority Data

Aug. 25, 2008  (EP) .................................... 08014970

(51) Int. Cl.
*C23C 14/28*  (2006.01)
*C23C 14/54*  (2006.01)
(Continued)

(52) U.S. Cl.
CPC ............... *C23C 14/28* (2013.01); *C23C 14/542* (2013.01); *C23C 14/56* (2013.01); *C23C 14/505* (2013.01)

(58) Field of Classification Search
CPC ..... C23C 14/28; C23C 14/505; C23C 14/524; C23C 14/56; B23K 26/026; B23K 26/0643; B23K 26/41
USPC ............. 219/121.61, 121.62, 121.78–121.82, 219/121.85, 121.15, 121.28–121.32, 219/121.35; 427/596, 597, 585, 586, 561, 427/566, 567
See application file for complete search history.

(56) References Cited

U.S. PATENT DOCUMENTS 4,740,386 A *   4/1988   Cheung .......................... 117/105
5,049,405 A *   9/1991   Cheung .......................... 427/596
(Continued)

FOREIGN PATENT DOCUMENTS

EP    1516854 A1    3/2005
JP    1319673 A     12/1989
(Continued)

OTHER PUBLICATIONS

Paul A. Tipler, Physics; worth publishers, incorporated; New York; 1976 (no month), excerpt pp. 160-162.*
(Continued)

*Primary Examiner* — Marianne L Padgett
(74) *Attorney, Agent, or Firm* — The Webb Law Firm

(57) ABSTRACT

The invention relates to a method for depositing a material for a target onto a surface of a sample, which method comprises the steps of: irradiating a surface of the target with a laser or electron beam to generate a plume of target material particles; positioning the sample near the plume, such that the target material particles are deposited onto the surface of the sample; rotating the sample around a rotation axis being perpendicular to the surface of the sample onto which the particles are deposited; moving the laser beam along the surface of the target, such that the plume moves in a radial direction in relation to the rotation axis; pulsing the laser beam at a variable frequency.

7 Claims, 1 Drawing Sheet

(51) Int. Cl.
  *C23C 14/56* (2006.01)
  *C23C 14/50* (2006.01)
  *C23C 14/30* (2006.01)

(56) References Cited

U.S. PATENT DOCUMENTS

| | | | | |
|---|---|---|---|---|
| 5,084,300 | A * | 1/1992 | Zander et al. | 505/474 |
| 5,411,772 | A * | 5/1995 | Cheung | 427/586 |
| 5,578,350 | A * | 11/1996 | Mai et al. | 427/596 |
| 5,622,567 | A * | 4/1997 | Kojima et al. | 118/726 |
| 5,733,609 | A * | 3/1998 | Wang | 427/561 |
| 6,090,207 | A * | 7/2000 | Knauss et al. | 118/715 |
| 6,297,138 | B1 * | 10/2001 | Rimai et al. | 438/597 |
| 6,372,103 | B1 * | 4/2002 | Perry et al. | 204/298.02 |
| 7,869,112 | B2 * | 1/2011 | Borchers et al. | 359/216.1 |
| 8,828,506 | B2 * | 9/2014 | Ruuttu et al. | 427/596 |
| 8,979,282 | B2 * | 3/2015 | Broekmaat et al. | 353/119 |
| 2003/0129324 | A1 * | 7/2003 | Genin et al. | 427/569 |
| 2004/0033702 | A1 * | 2/2004 | Tamanyan et al. | 438/789 |
| 2005/0014033 | A1 * | 1/2005 | Cheung et al. | 428/701 |
| 2007/0026160 | A1 * | 2/2007 | Strikovski et al. | 427/496 |
| 2011/0292354 | A1 * | 12/2011 | Broekmaat et al. | 353/97 |
| 2012/0122317 | A1 * | 5/2012 | Broekmaat et al. | 438/758 |

FOREIGN PATENT DOCUMENTS

| | | | | |
|---|---|---|---|---|
| JP | 7-070740 A | * | 3/1995 | C23C 14/28 |
| WO | WO 99/13127 A1 | * | 3/1999 | C23C 14/28 |

OTHER PUBLICATIONS

Boughaba et al., "Ultrathin Ta2O5 films produced by large-area pulsed laser deposition", Thin Solid Films, Aug. 1, 2000, pp. 119-125. vol. 371.

* cited by examiner

METHOD FOR DEPOSITING A MATERIAL

BACKGROUND OF THE INVENTION

1) Field of the Invention

The invention relates to a method for depositing a material of a target onto a surface of a sample, which method comprises the steps of:
- irradiating a surface of the target with a laser or electron beam to generate a plume of target material particles;
- positioning the sample near the plume, such that the target material particles are deposited onto the surface of the sample.

2) Description of the Related Art

Depositing a material of a target onto a surface of a sample can be done with so-called pulsed laser deposition (PLD) This PLD technique enables one to coat objects with a material of choice of a very high quality and in a very thin layer. This pulsed laser deposition technique is often used in research environments.

However, it is desired to be able to have the advantages of the PLD technique in the industry. The difficulty is however that the PLD technique is only suited for small scale applications. With the current technology typically a surface of about 10 mm by 10 mm is covered in a homogeneously layer. This area is limited by the plasma plume created during the PLD technique. This plume is only uniform in a small area of typically 10 mm by 10 mm.

SUMMARY OF THE INVENTION

It is now an object of the invention to resolve the above-mentioned problem.

This object is achieved with a method according to the invention, which is characterized by:
- rotating the sample around a rotation axis being perpendicular to the surface of the sample onto which the particles are deposited;
- moving the laser beam along the surface of the target, such that the plume moves in a radial direction in relation to the rotation axis;
- pulsing the laser beam at a variable frequency.

By rotating the sample around a rotation axis it is possible to have the plume deposit material on an annular area on the sample. By moving the laser beam along the surface of the target in a radial direction it is possible to cover the full surface of a disc shaped sample surface. So although the effective plume of PLD is only typically 10 mm by 10 mm it is still possible to cover a far larger sample surface.

It is however necessary to furthermore pulse the laser beam at a variable frequency in order to maintain a homogeneous deposition of target material onto the sample and to maintain a homogeneous pulse rate over the total substrate area for homogeneous thin film properties. If for example a constant angular velocity of the sample is maintained, less target material would be necessary for the annular surface near the center of rotation, than an annular surface at the distance from this rotation axis. By varying the frequency of the pulsed laser beam it is easy to provide for a homogenous distribution of target material particles over the full surface of the sample.

In an embodiment of the method according to the invention, the sample surface is disc shaped and preferably the surface of the target is substantially parallel to the surface of the sample.

In a preferred embodiment of the method according to the invention the target material is a rod, which is rotatable along its longitudinal axis. When the target material is irradiated by the laser beam a small portion of the material will be ablated and these particles will form the plume. If the laser beam irradiates only one small portion of the target the ablated amount of material will become substantial and will disturb the PLD process. In particular when large surfaces are coated with this PLD technique according to the invention substantial amounts of material will be ablated and this will have its effect on the target material and onto the process. Now by providing a rod shaped target material, which can be rotated along its longitudinal axis it is possible to switch the area at the target material from which the material is ablated. In combination with the moving laser beam and rotation of the rod it is possible to have an even ablation of material from the target material.

In another preferred embodiment of the method according to the invention the angular velocity of the sample is dependent on the distance between the rotation axis and the contact area of the laser beam on the surface of the target.

By varying the angular velocity of the sample it provides for a further control parameter to have a homogeneous deposition of material onto the sample.

In yet another embodiment of the method according to the invention the pulse frequency of the laser beam is dependent on the distance between the rotation axis and the contact area of the laser beam on the surface of the target. As already described, with a constant angular velocity, the pulse frequency would be lower when depositing near the center of the sample than when depositing at the outer edge of the sample. However, if the angular velocity is also varied an optimum can be simply calculated.

Preferably the pulsing frequency of the laser beam is in the range of 1 Hz and 500 Hz.

BRIEF DESCRIPTION OF THE DRAWINGS

These and other features of the invention will be elucidated in conjunction with the accompanying drawings.

DETAILED DESCRIPTION OF THE PREFERRED EMBODIMENTS

Figure 1:
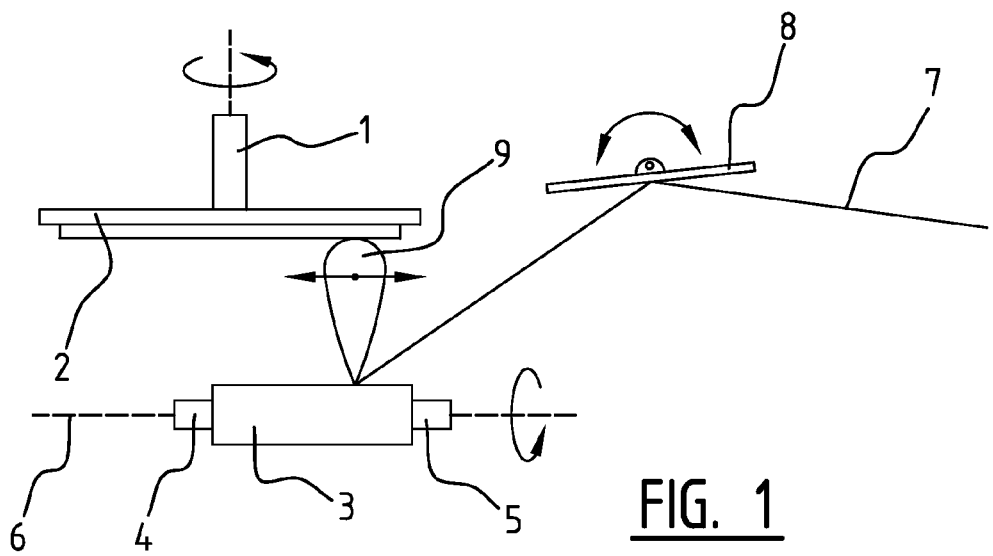
FIG. 1 shows in schematic way the method according to the invention.

In FIG. 1 a rotatable sample holder 1 is shown. Onto this rotatable sample holder 1 a sample 2 is arranged. This sample 2 is typically a thin disc of a suitable material, which needs to be coated.

Underneath the sample holder 1 and sample 2 a target material 3 is arranged. This target material has the shape of a rod and has two journals 4, 5 with which the target material 3 can be rotated along the longitudinal axis 6.

A laser beam 7 from a laser device (not shown) is directed onto a mirror 8. This mirror 8 is tiltable.

The laser beam 7 is reflected by the mirror 8 and projected onto the target material 3 in order to create a plume 9. This plume 9 consists out of ablated target material 3.

By tilting the mirror 8 the fixed laser beam 7 can be moved over the surface of the target material 3 in the direction of the longitudinal axis 6. As a result the plume 9 is movable in radial direction of the sample disc 2.

Figure 2:
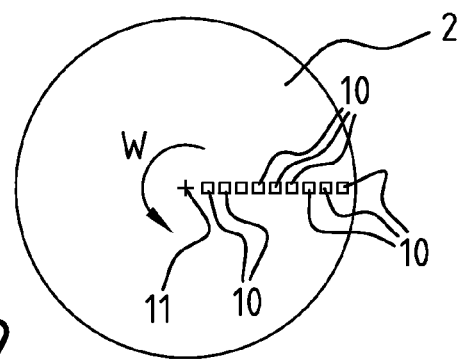
FIG. 2 shows a top view of a sample with schematically shown the positions.

In FIG. 2 the sample disc 2 is shown and a number of depositions 10. These depositions 10 are the result of the plume 9. By tilting the mirror 8 plume 9 is moved in radial direction of the disc 2 having the result shown in FIG. 2.

Now by rotating the sample disc these depositions can be spread over the full surface of the disc 2. As will be apparent from FIG. 2 this would result in a higher deposition of material near the center 11 than near the edge of the sample disc, when the angular velocity w is kept constant and the deposition rate is also kept constant, by keeping the laser frequency rate constant. Therefore as a result of the invention the deposition rate is modified by varying the frequency of the laser beam such that less material is deposited near the center 11 and more material deposited near the edge of the sample disc. By varying at least the pulse frequency and preferably also the angular velocity it is possible to have a sample surface with dimensions far larger than the conventional dimensions of a deposit area 10 coated homogeneously.

Figure 3:
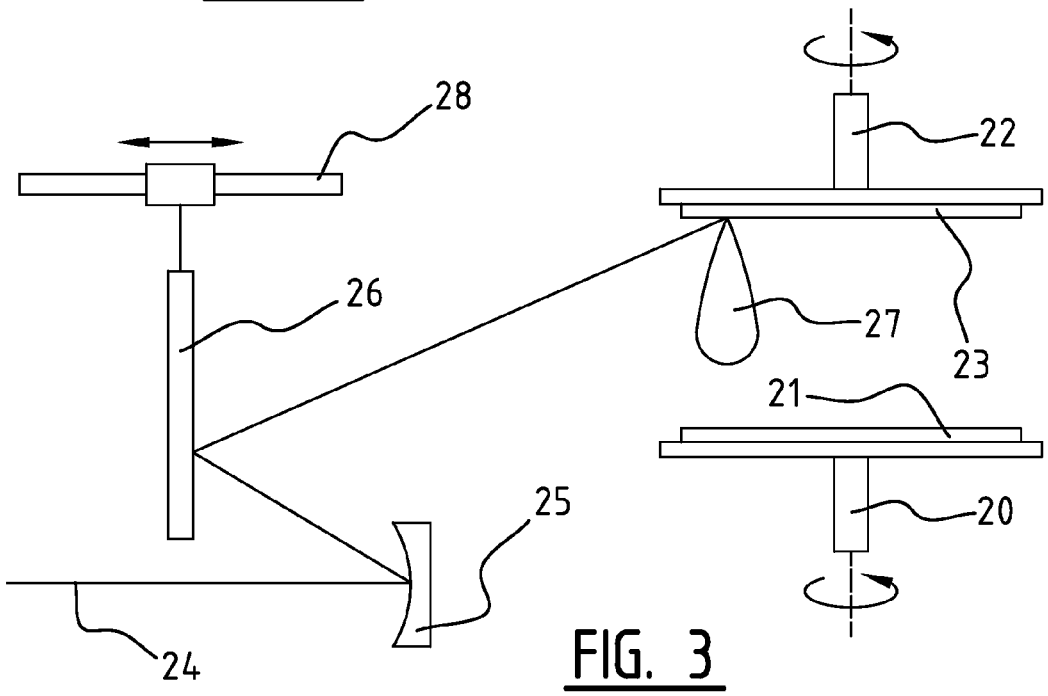
FIG. 3 shows a second embodiment of the invention.

FIG. 3 shows a second embodiment in a schematic view of the invention. A rotatable sample holder 20 is shown onto which a sample 21 is arranged. Above this rotatable sample holder a rotatable target material holder 22 is arranged. On this target holder 22 a target 23 is placed, which has in this embodiment a disc-like shape.

Furthermore, FIG. 3 shows a laser beam or electron beam 24, which is directed to a focused mirror 25 which directs the laser beam to a translatable flat mirror 26. This flat mirror 26 directs the laser beam onto the target material 23 causing a plume 27 of particles of the target material, which will be deposited onto the sample material 21.

The flat mirror 26 is guided along a guide 28 such that the mirror 26 can be translated. By translating the mirror 26 the laser beam 24 can be moved over the surface of the target material 23 and thus the plume 27 can be moved over de surface of the sample material 21.

The invention claimed is:

1. A method for depositing a material of a target onto a surface of a sample, which method comprises the steps of:
    (a) irradiating a surface of the target with a laser to generate a plume of target material particles;
    (b) positioning the sample near the plume, such that the target material particles are deposited onto the surface of the sample;
    (c) rotating the sample around a rotation axis which extends from a center of the sample and is perpendicular to the surface of the sample onto which the particles are deposited;
    (d) moving the laser beam along the surface of the target, such that the plume moves in a radial direction in relation to the rotation axis, wherein the laser beam is directed by a translatable mirror and the mirror is translated in a direction that is parallel to both the target and the substrate resulting in movement of the laser beam along the surface of the target; and
    (e) pulsing the laser beam,
    wherein the pulse frequency of the laser beam is changed as the distance between the plume and the center of the sample is changed such that a greater amount of target material particles are deposited at an edge of the sample than at a center of the sample.

2. The method according to claim 1, wherein the sample surface is disc shaped.

3. The method according to claim 1, wherein the surface of the target is substantially parallel to the surface of the sample.

4. The method according to claim 1, wherein the target material is a rod, which is rotatable along its longitudinal axis.

5. The method according to claim 1, wherein the angular velocity of the sample is chosen based on the distance between a contact area of the laser beam on the surface of the target and an intersection of the rotation axis with the surface of the target.

6. The method according to claim 1, wherein pulse frequency of the laser beam is chosen based on the distance between a contact area of the laser beam on the surface of the target and the intersection of the rotation axis with the surface of the target.

7. The method according to claim 1, wherein the pulse frequency is in the range of 1 Hz and 500 Hz.

\* \* \* \* \*